(12) United States Patent
Ahn et al.

(10) Patent No.: US 9,793,180 B2
(45) Date of Patent: Oct. 17, 2017

(54) SEMICONDUCTOR DEVICE AND MANUFACTURING METHOD THEREOF

(71) Applicant: Amkor Technology, Inc., Chandler, AZ (US)

(72) Inventors: Seo Yeon Ahn, Gyeonggi-do (KR); Doo Hyun Park, Gyeonggi-do (KR); Pil Je Sung, Seoul (KR); Won Chul Do, Gyeonggi-do (KR); Young Rae Kim, Gyeonggi-do (KR); Seung Chul Han, Gyeonggi-do (KR); Joo Hyun Kim, Chungcheongnam-do (KR); Jong Sik Paek, Incheon (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 14/313,363

(22) Filed: Jun. 24, 2014

(65) Prior Publication Data

US 2015/0206807 A1    Jul. 23, 2015

(30) Foreign Application Priority Data

Jan. 22, 2014    (KR) .................. 10-2014-0007894

(51) Int. Cl.
*H01L 23/12*    (2006.01)
*H01L 21/66*    (2006.01)
(Continued)

(52) U.S. Cl.
CPC ............. *H01L 22/14* (2013.01); *H01L 21/78* (2013.01); *H01L 22/22* (2013.01); *H01L 24/14* (2013.01);
(Continued)

(58) Field of Classification Search
CPC ....... H01L 2924/00; H01L 2924/00014; H01L 2224/73265; H01L 2924/0002; H01L 2224/48227; H01L 2224/16225; H01L 2924/014; H01L 2924/10253; H01L 2924/15311; H01L 2224/48091; H01L 2924/00012
(Continued)

(56) References Cited

U.S. PATENT DOCUMENTS 5,399,982 A * 3/1995 Driller ............... G01R 1/07378
29/705
6,002,178 A * 12/1999 Lin ............................. 257/778
(Continued)

FOREIGN PATENT DOCUMENTS

JP       2011169854 A    9/2011
KR    1020120032772 A    4/2012
(Continued)

OTHER PUBLICATIONS

Korean Notice of Allowance dated Apr. 11, 2016 for Korean Patent Application No. 10-2014-0007894.

*Primary Examiner* — Tod T Van Roy
*Assistant Examiner* — Vu A Vu
(74) *Attorney, Agent, or Firm* — McAndrews, Held & Malloy, Ltd.

(57) ABSTRACT

A semiconductor device and manufacturing method thereof. Various aspects of the disclosure may, for example, comprise connection verification for a first one or more mounted components prior to additional assembly.

20 Claims, 12 Drawing Sheets

(51) Int. Cl.
*H01L 21/78* (2006.01)
*H01L 23/00* (2006.01)
*H01L 23/31* (2006.01)
*H01L 21/56* (2006.01)
*H01L 23/498* (2006.01)

(52) U.S. Cl.
CPC .............. *H01L 24/32* (2013.01); *H01L 24/92* (2013.01); *H01L 24/97* (2013.01); *H01L 21/561* (2013.01); *H01L 23/3128* (2013.01); *H01L 23/49816* (2013.01); *H01L 24/13* (2013.01); *H01L 24/16* (2013.01); *H01L 24/29* (2013.01); *H01L 24/73* (2013.01); *H01L 24/81* (2013.01); *H01L 24/83* (2013.01); *H01L 2224/13101* (2013.01); *H01L 2224/16225* (2013.01); *H01L 2224/2919* (2013.01); *H01L 2224/32225* (2013.01); *H01L 2224/73204* (2013.01); *H01L 2224/81001* (2013.01); *H01L 2224/81908* (2013.01); *H01L 2224/83001* (2013.01); *H01L 2224/839* (2013.01); *H01L 2224/83951* (2013.01); *H01L 2224/92125* (2013.01); *H01L 2924/12042* (2013.01); *H01L 2924/15311* (2013.01); *H01L 2924/18161* (2013.01); *H01L 2924/37001* (2013.01)

(58) Field of Classification Search
USPC .......................................................... 257/700
See application file for complete search history.

(56) References Cited

U.S. PATENT DOCUMENTS

| | | | | |
|---|---|---|---|---|
| 6,025,648 | A | * | 2/2000 | Takahashi et al. ........... 257/778 |
| 6,929,976 | B2 | * | 8/2005 | Chan et al. ................... 438/106 |
| 7,391,104 | B1 | * | 6/2008 | Chang et al. ................. 257/678 |
| 2012/0061853 | A1 | * | 3/2012 | Su ......................... H01L 21/563 257/778 |
| 2013/0009316 | A1 | * | 1/2013 | Wang .................. H01L 25/0655 257/774 |

FOREIGN PATENT DOCUMENTS

| | | |
|---|---|---|
| KR | 1020130076748 A | 7/2013 |
| KR | 1020130088717 A | 8/2013 |

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2014-0007894, filed on Jan. 22, 2014, the contents of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present systems, devices, and/or manufacturing methods are inadequate, for example resulting in excessive scrapped components. Further limitations and disadvantages of conventional and traditional approaches will become apparent to one of skill in the art, through comparison of such approaches with the various aspects of the present disclosure as set forth in the remainder of the present application with reference to the drawings.

DETAILED DESCRIPTION

Figure 1:
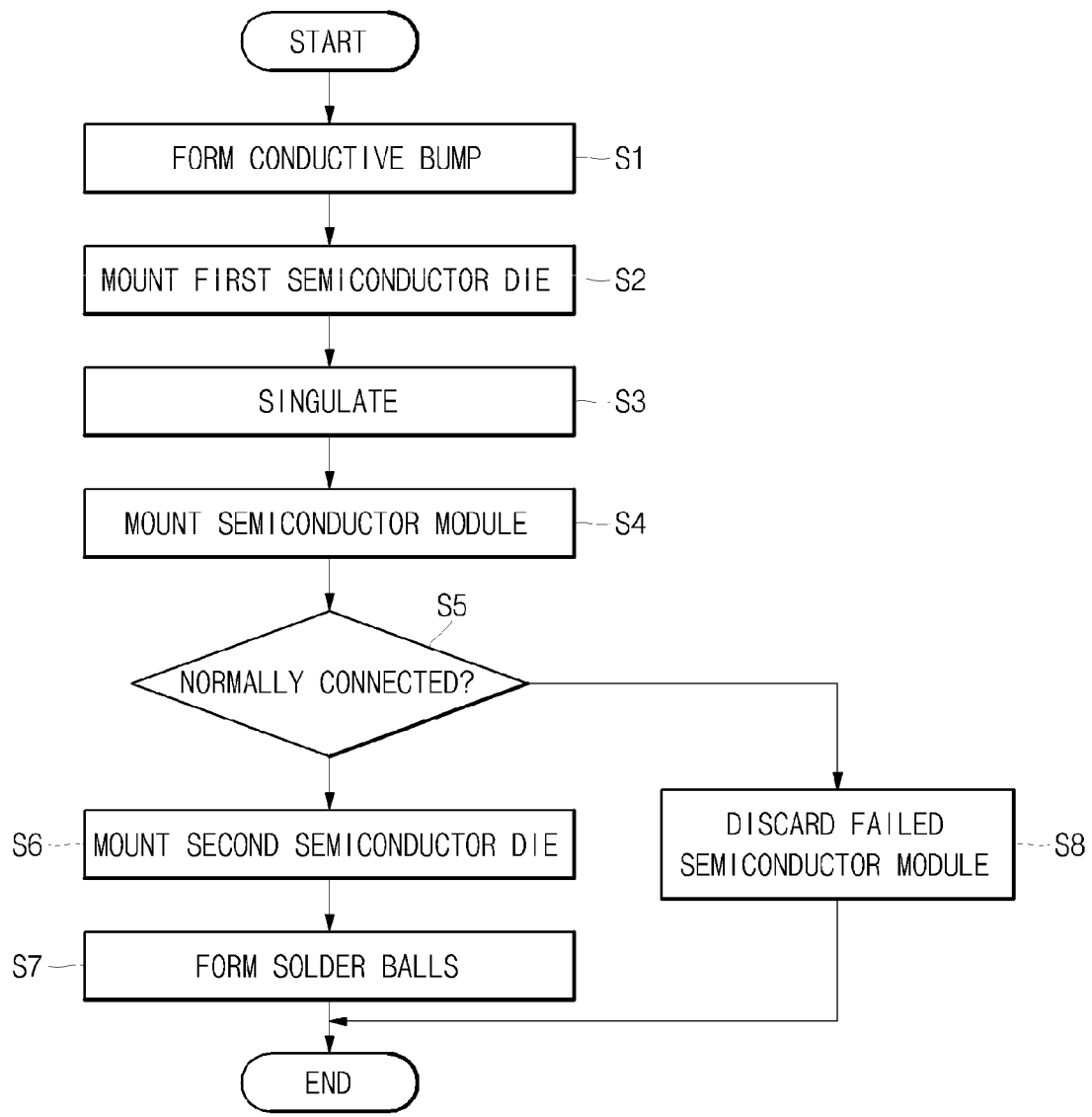
FIG. 1 is a flowchart of a manufacturing method of a semiconductor device according to various aspects of the disclosure.

The following discussion presents various aspects of the present disclosure by providing various examples thereof. Such examples are non-limiting, and thus the scope of various aspects of the present disclosure should not necessarily be limited by any particular characteristics of the provided examples.

As utilized herein, the phrases "for example" and "e.g." are non-limiting and are generally synonymous with "by way of example and not limitation," "for example and not limitation," and the like. Similarly, as utilized herein, the term "exemplary" means serving as a non-limiting example, instance, or illustration.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As utilized herein, the phrases "operates to" and "is operable to" describe functionality performed by particular hardware, including hardware operating in accordance with software instructions. The phrases "operates to" and "is operable to" include "operates when enabled to". For example, a module that operates to perform a particular operation, but only after receiving a signal to enable such operation, is included by the phrase "operates to."

The terminology used herein is for the purpose of describing particular example embodiments only and is not intended to be limiting of the disclosure. As used herein, the singular forms are intended to include the plural forms as well, unless the context clearly indicates otherwise. It will be further understood that the terms "include," "comprise," "including," and/or "comprising," when used in this specification, specify the presence of stated features, integers, steps, operations, elements, and/or components, but do not preclude the presence or addition of one or more other features, integers, steps, operations, elements, components, and/or groups thereof. In other words, such terms are generally described as being open-ended.

It will be understood that, although the terms first, second, etc. may be used herein to describe various elements, components, regions, layers and/or sections, these elements should not be limited by these terms. These terms are only used to distinguish one element from another element, component, region, layer and/or section. Thus, for example, a first element, a first component, a first region, a first layer and/or a first section discussed below could be termed a second element, a second component, a second region, a second layer and/or a second section without departing from the teachings of the present disclosure.

Various aspects of this disclosure address drawbacks in conventional systems by providing a semiconductor device and a manufacturing method thereof, which can test whether the semiconductor device is normally (or properly) connected or not in the middle of the manufacturing process, for example, in a state in which one semiconductor die is mounted on an interposer, thereby preventing other semiconductor die from being additionally mounted on the semiconductor device and discarded if an abnormality (or defect) is detected in the middle of the manufacturing process, and ultimately improving the manufacturing yield.

In accordance with an aspect of the present disclosure, there is provided a manufacturing method of a semiconductor device, the manufacturing method comprising mounting a first semiconductor die on a first surface of an interposer to electrically connect the first semiconductor die to the interposer, singulating discrete semiconductor modules by dicing the interposer, mounting the semiconductor module on a first surface of a printed circuit board (e.g., a packaging substrate or other) to connect conductive bumps on a second surface of the interposer of the semiconductor module to a first conductive pattern exposed to the first surface of the printed circuit board, testing for a connection failure (and/or component failure) through a second conductive pattern exposed to the second surface of the printed circuit board, and if it is determined in the testing that the semiconductor device is in a normally connected state, then mounting a second semiconductor die to electrically connect the second semiconductor die to the first surface of the interposer.

The singulating may, for example, comprise attaching a first film to cover the first surface of the interposer and the first semiconductor die, and dicing the second surface of the interposer to divide the interposer into discrete semiconductor modules, and expanding the first film to increase a distance between the semiconductor modules.

After the mounting of the second semiconductor die, the manufacturing method may, for example, further comprise forming solder balls on a second conductive pattern exposed to the second surface of the printed circuit board.

In the testing, if for example it is determined that the printed circuit board having the semiconductor modules mounted thereon is abnormally (or improperly) connected, the manufacturing method may further comprise discarding failed printed circuit boards having the semiconductor modules mounted thereon.

Before the mounting of the first semiconductor die, the manufacturing method may, for example, further comprise forming conductive bumps on a second wiring pattern formed on the second surface of the interposer.

After the mounting of the first semiconductor die, the manufacturing method may, for example, further comprise forming a shock-absorbing member so as to cover all of side portions of the first semiconductor die and the first surface of the interposer.

The singulating may, for example, comprise attaching a first film to cover the shock-absorbing member and the first surface of the first semiconductor die, attaching a second film so as to cover the second surface of the interposer, removing the first film and the shock-absorbing member for cleaning, and dicing the first surface of the interposer to divide the interposer into discrete semiconductor modules (or, e.g., to create break lines) and expanding the film to increase a distance between the semiconductor modules.

In the mounting of the first semiconductor die, the first semiconductor die may, for example, be mounted on the first surface of the interposer to connect at least a first conductive pillar of the first semiconductor die to the first wiring pattern formed on the first surface of the interposer, and a first underfill may be formed to cover both of the first conductive pillar and the first wiring pattern.

After the mounting of the first semiconductor die, the manufacturing method may further comprise forming a shock-absorbing pad so as to cover the first wiring pattern of the interposer (or a portion thereof, or a portion thereof that is to be connected to the second semiconductor die, etc.), which is not connected to the first semiconductor die.

After the forming of the shock-absorbing pad, the manufacturing method may further comprise encapsulating to cover at least the side portions of the first semiconductor die and the first surface of the interposer by, for example, forming an encapsulant on a space between the first semiconductor die and the shock-absorbing pad.

The singulating may, for example, comprise dicing the encapsulant formed on the first surface of the interposer to divide the encapsulant into discrete semiconductor modules, attaching a first film to cover the encapsulant and the shock-absorbing pad, and expanding the film to increase the distance between the semiconductor modules.

In the mounting of the semiconductor module, the semiconductor module may, for example) be mounted on the first surface of the printed circuit board to connect the conductive bumps formed on the second surface of the interposer to the first conductive pattern exposed to (or on) the first surface of the printed circuit board, and a second underfill may be formed to cover both of the conductive bumps and the first conductive pattern exposed to the first surface of the printed circuit board.

In the mounting of the second semiconductor die, the second semiconductor die may, for example, be mounted on the first surface of the interposer to connect at least a second conductive pillar of the second semiconductor die to the first wiring pattern formed on the first surface of the interposer, and a third underfill may be formed to both of the second conductive pillar and the first wiring pattern.

In accordance with another aspect of the present disclosure, there is provided a semiconductor device comprising an interposer comprising a plurality of first wiring patterns formed on its first surface and a plurality of second wiring patterns formed on its second surface, a first semiconductor die having first conductive pillars connected to the first wiring patterns of the interposer, a second semiconductor die having second conductive pillars connected to the first wiring patterns of the interposer and spaced apart from the first semiconductor die, an encapsulant formed to entirely cover side portions of at least the first semiconductor die, and a plurality of conductive bumps connected to the second wiring pattern of the interposer.

The semiconductor device may further comprise a printed circuit board having a first surface and a second surface and having the first conductive pattern exposed to the first surface connected to the conductive bumps, and a plurality of solder balls formed on the second conductive pattern exposed to the second surface of the printed circuit board.

As described above, in the semiconductor device and a manufacturing method thereof, the device can be tested in the middle of the manufacturing process in a state in which one semiconductor die is mounted on an interposer, whether the semiconductor device is in a normally connected state (and/or is itself defective, for example originally defective and/or developing a defect during the production process) or not. Therefore, if abnormality is detected in the middle of the manufacturing process, it is possible to prevent other semiconductor die from being additionally mounted on the semiconductor device and unnecessarily discarded, thereby ultimately improving the manufacturing yield.

Various aspects of the present disclosure are best understood by reference to the following detailed description when read in conjunction with the accompanying drawings.

Hereinafter, various aspects of the present disclosure will be described with reference to FIGS. 1A to 6G. Example embodiments of various aspects of the present disclosure will now be described more fully hereinafter with reference to the accompanying drawings; however, they may be embodied in different forms and should not be construed as limited to the embodiments set forth herein.

In the drawing figures, the dimensions of layers and regions may be exaggerated for clarity of illustration. Like reference numerals refer to like elements throughout.

FIG. 1 is a flowchart of a manufacturing method of a semiconductor device according to various aspects of the disclosure. As illustrated in FIG. 1, the example manufacturing method may comprise forming conductive bumps (S1), mounting a first semiconductor die (S2), singulating (S3), mounting a semiconductor module (S4), testing (S5), mounting a second semiconductor die (S6), forming solder balls (S7) and discharging a failed semiconductor module (S8).

The example manufacturing method of the semiconductor device will now be described in detail with reference also to FIGS. 2A to 2I.

Figure 2A:
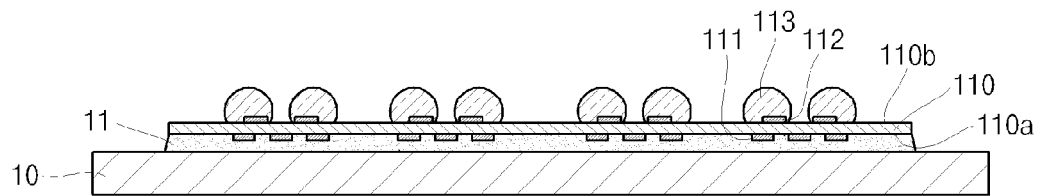
FIGS. 2A to 2K are cross-sectional views of a semiconductor device at various stages of processing, in accordance with various aspects of the disclosure.

Referring to FIG. 2A, there is illustrated a cross-sectional view of an example of the forming of conductive bumps (S1) in the example manufacturing method of the semiconductor device. In the forming of the conductive bumps (S1), a plurality of conductive bumps 113 may be formed to be electrically connected to a plurality of second wiring patterns 112 formed on a second surface 110b of the interposer 110. The interposer 110 has a first surface 110a that is planar and the second surface 110b that is opposite to the first surface 110a and is planar, and further comprises a plurality of first wiring patterns 111 formed on the first surface 110a. The interposer 110 may comprise a printed circuit board, a circuit tape, a circuit film, or equivalents thereof, but aspects of the present disclosure are not limited thereto. For example, the interposer 110 may comprise an insulation layer, and the first wiring patterns 111 and the second wiring patterns 112 formed on the first surface 110a and the second surface 110b, respectively, may be electrically connected to each other through a plurality of redistribution layers, through silicon vias (TSVs) provided in the insulation layer, etc.

In the forming of the conductive bumps (S1), for example in order to prevent the interposer 110 from being carried or damaged, the first carrier 10 may be adhered to the first surface 110a of the interposer 110 through an adhesive 11. For example, in the forming of the conductive bumps (S1), a plurality of conductive bumps 113 may be formed on the second wiring patterns 112 of the interposer 110 carried by the first carrier 10. The first carrier 10 may be a glass carrier, but aspects of the present disclosure are not limited thereto.

Referring to FIGS. 2B to 2E, there are illustrated cross-sectional views of an example of the mounting of a first semiconductor die (S2) in the example manufacturing method of the semiconductor device. In the mounting of the first semiconductor die (S2), a first semiconductor die 120 is mounted on the first surface 110a of the interposer 110 to be electrically connected to the first wiring patterns 111 of the interposer 110.

Figure 2B:
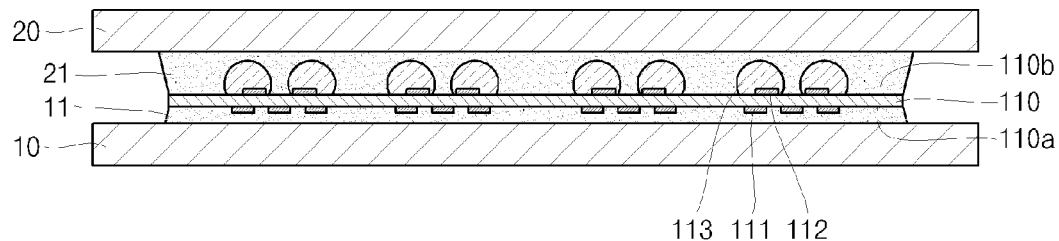
Figure 2C:
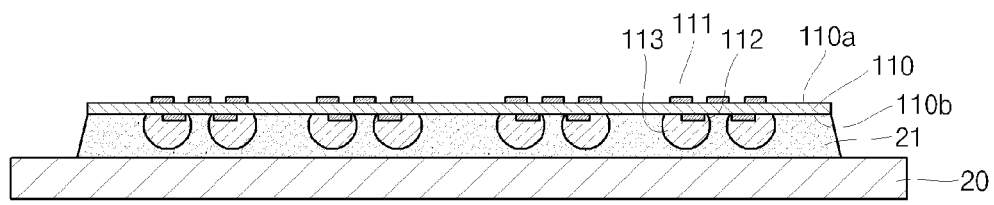

In the mounting of the first semiconductor die (S2), as illustrated by example in FIG. 2B, a second carrier 20 is adhered to the second surface 110b of the interposer 110 having the conductive bumps 113 using an adhesive 21. Thereafter, as shown by example in FIG. 2C, the first carrier 10 adhered to the first surface 110a of the interposer 110 is separated from the interposer 110 and the adhesive 11 is then removed. For example, the first carrier 10 is separated from the interposer 110, thereby exposing the first surface 110a of the interposer 110 to the outside. Here, adhesive remaining on the first surface 110a of the interposer 110, if any, may be removed by a cleaning process.

Figure 2D:
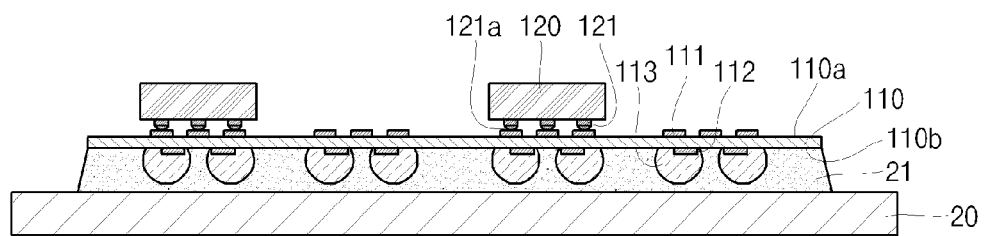

Thereafter, as illustrated in FIG. 2D, the first semiconductor die 120 is mounted on the interposer 110 to make the first wiring patterns 111 of the interposer 110 contact first conductive pillars 121 of the first semiconductor die 120. Each of the first conductive pillars 121 may further comprise a solder cap 121a formed at an end, for example to enhance connectivity to the first wiring patterns 111. The first semiconductor die 120 may, for example, be a logic chip, but aspects of the present disclosure are not limited thereto. As shown in FIG. 2D, a plurality of first devices 120 (e.g., 120a) may be similarly mounted to the interposer 110, which may for example be in wafer or panel form.

Figure 2E:
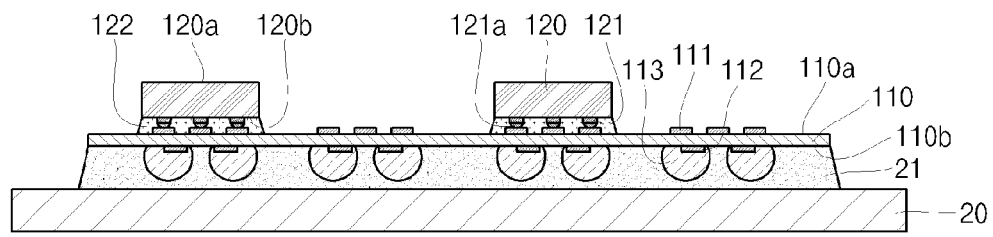

Thereafter, as illustrated by example in FIG. 2E, a first underfill 122 is filled between the interposer 110 and the first semiconductor die 120. The first underfill 122 is filled between the second surface 120b of the first semiconductor die 120 and the first surface 110a of the interposer 110, which face each other, thereby protecting the first conductive pillars 121 and the first wiring patterns 111 from external surroundings.

Figure 2F:
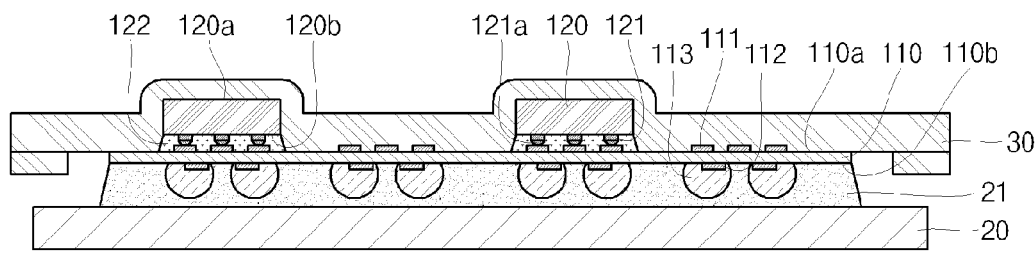
Figure 2G:
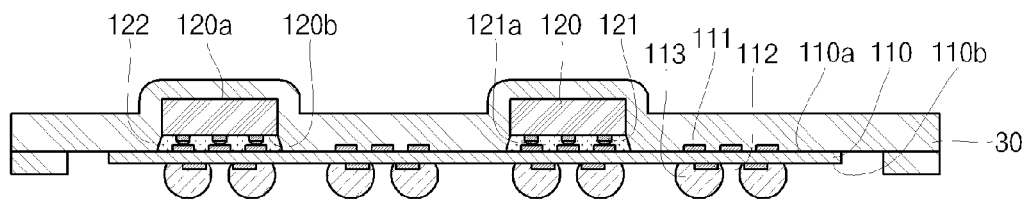
Figure 2H:
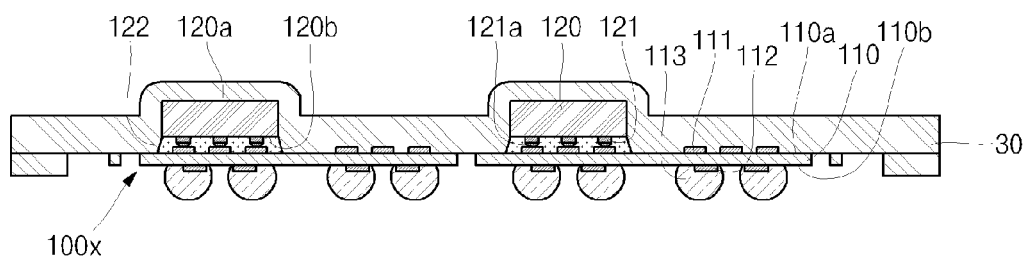

Referring to FIGS. 2F to 2H, there are illustrated cross-sectional views of the singulating (S3) in the manufacturing method of the semiconductor device. In the singulating (S3), the interposer 110 (e.g., an interposer wafer or panel) may be diced to divide the same into discrete semiconductor modules 100x.

The singulating (S3) may, for example, comprise attaching a first film 30 to cover the first surface 110a of the interposer 110, dicing the second surface 110b of the interposer 110 and expanding the first film 30 to increase a distance between discrete semiconductor modules 100x. Here, each of the semiconductor modules 100x refers to an individual interposer 110 having one first semiconductor die 120 mounted thereon. For example, in the singulating (S3), the interposer 110 having a plurality of first semiconductor die 120 mounted thereon is divided into a plurality of semiconductor modules 100x as individual interposers 110 each having one of the first semiconductor die 120.

In the attaching of the first film 30, an example illustration of which is provided at FIG. 2F, the first film 30 is attached to cover both of the first surface 110a of the interposer 110 and the first semiconductor die 120. The first film 30 may comprise an adhesive layer cured by UV light or heat.

Thereafter, as illustrated by example in FIG. 2G, the second carrier 20 adhered to the second surface 110b of the interposer 110 may be separated from the second surface 110b of the interposer 110, and the adhesive 21 provided between the second carrier 20 and the second surface 110b of the interposer 110 for adhesion, may be removed. The adhesive 21 may, for example, be removed by UV light or heat, but aspects of the present disclosure are not limited thereto.

Thereafter, as illustrated by example in FIG. 2H, after the second carrier 20 is removed and the interposer 110 may be diced into the respective semiconductor modules 100x from the second surface 110b of the interposer 110 exposed to the outside. The dicing may, for example, comprise blade dicing, laser dicing, and so on, but aspects of the present disclosure are not limited thereto. In addition, in the expanding, the first film 30 may be expanded to increase the distance between each of the diced semiconductor modules 100x, thereby providing additional separation between the modules and providing for convenient module handling (e.g., by automated pick-and-place equipment). In addition, adhesion may be removed by applying UV light or heat to the first film 30, and the respective semiconductor modules 100x may be separated through a picking-up operation.

Figure 2I:
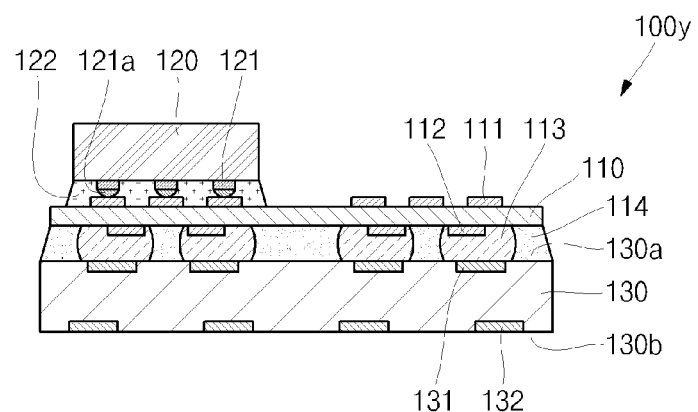

Referring to FIG. 2I, there is illustrated by example a cross-sectional view of the mounting of a semiconductor module (S4) in the manufacturing method of the semiconductor device. In the mounting of the semiconductor module (S4), the semiconductor modules 100x are mounted on the first surface 130a of the printed circuit board 130 to connect conductive bumps 113 of the discrete semiconductor modules 100x to a first conductive pattern 131 exposed to the first surface 130a of the printed circuit board 130. Here, the conductive pillars 121 of the first semiconductor die 120 may be electrically connected to the printed circuit board 130 through the interposer 110 and the first conductive pattern 131. The printed circuit board 130 may, for example, comprise an insulation layer having a first surface 130a that is substantially planar and a second surface 130b that is opposite to the first surface 130a, and conductive pattern layers comprising multiple layers provided in the insulation layer. The conductive pattern layers of the printed circuit board 130 may, for example, comprise the first conductive pattern 131 exposed to the first surface 130a of the printed circuit board 130 and a second conductive pattern 132 exposed to the second surface 130b of the printed circuit board 130. For example, the first conductive pattern 131 and the second conductive pattern 132 may be electrically connected to each other by the conductive pattern layers provided in the insulation layer. In addition, the printed circuit board 130 may further comprise conductive pads additionally provided to the first conductive pattern 131 and the second conductive pattern 132.

In addition, after the semiconductor modules 100x are mounted on the printed circuit board 130, a second underfill 114 may be filled between the interposer 110 and the printed circuit board 130. The second underfill 114 may be filled between the second surface 110b of the interposer 110 and the first surface 130a of the printed circuit board 130, which face each other, thereby protecting the conductive bumps 113 and the first conductive pattern 131 from external surroundings.

In the testing (S5), as illustrated by example in FIG. 2I, testing may be performed on the semiconductor device 100y comprising the printed circuit board 130, the interposer 110 and the first semiconductor die 120. In the testing (S5), in the semiconductor device 100y, the second conductive pattern 132 exposed to the second surface 130b of the printed circuit board 130 may be connected to a test equipment (not shown) to test whether there is a connection failure (and/or component failure) between each of the printed circuit board 130, the interposer 110 and the first semiconductor die 120 in the semiconductor device 100y.

In the testing (S5), if for example it is determined that the semiconductor device 100y is in a normally (or properly) connected state, the second semiconductor die may be mounted (S6).

Figure 2J:
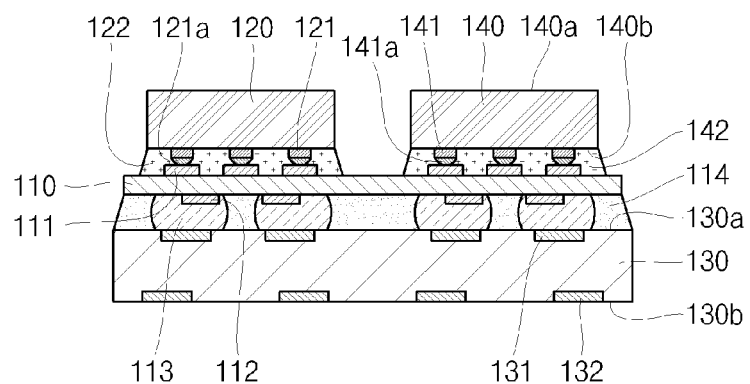

Referring to FIG. 2J, there is illustrated by example a cross-sectional view of the mounting of a second semiconductor die (S6) in the manufacturing method of the semiconductor device.

As illustrated by example in FIG. 2J, in the mounting of the second semiconductor die (S6), the second semiconductor die 140 may be mounted on the first surface 110a of the interposer 110 to be connected to the first wiring patterns 111 of the interposer 110.

In the mounting of the second semiconductor die (S6), the second semiconductor die 140 may be mounted on the interposer 110 to connect (e.g., electrically and/or mechanically) the first wiring patterns 111 of the interposer 110 and the second conductive pillars 141 of the second semiconductor die 140. Each of the second conductive pillars 141 may, for example, further comprise a solder cap 121a formed at an end so as to enhance connectability to the first wiring patterns 111. The second semiconductor die 140 may, for example be a logic chip, but aspects of the present disclosure are not limited thereto.

Thereafter, a third underfill 142 may be filled between the interposer 110 and the second semiconductor die 140. The third underfill 142 may be filled between the second surface 140b of the second semiconductor die 140 and the first surface 110a of the interposer 110, which face each other, thereby protecting the second conductive pillars 141 and the first wiring patterns 111 from external surroundings.

Figure 2K:
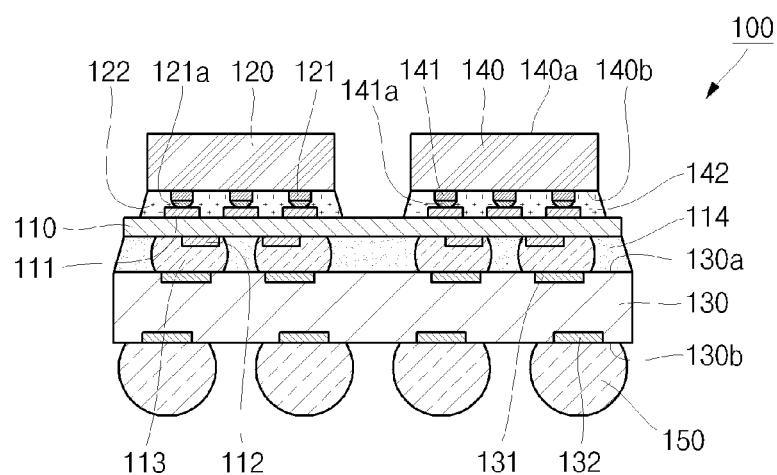

Referring to FIG. 2K, there is illustrated by example a cross-sectional view of the forming of solder balls (S7) in the manufacturing method of the semiconductor device. In the forming of the solder balls (S7), as illustrated in FIG. 2K, the plurality of solder balls 150 are formed to be connected to the second conductive pattern 132 exposed to the second surface 130b of the printed circuit board 130, thereby forming the semiconductor device 100.

In the testing (S5), if it is determined that the semiconductor device 100y is in an abnormally connected state (or is otherwise defective), the failed semiconductor device 100y may be discarded at (S8).

In the manufacturing method of the semiconductor device, it can be tested whether the completed semiconductor device is in an abnormally connected state (or otherwise defective), in the middle of the manufacturing process in a state in which one (or less than all) semiconductor die is mounted on the interposer. Therefore, it is possible to prevent relatively high-priced semiconductor die from being additionally mounted and unnecessarily discarded, thereby improving the manufacturing yield of the semiconductor device. Note that although the previous example showed only one first component being mounted and tested before mounting a second component, any number of first components (e.g., active and/or passive devices) may be mounted and tested before mounting any number of second components. Additionally, such testing may be performed multiple times during the production of a module, for example after mounting a second component and before mounting a third component.

Figure 3:
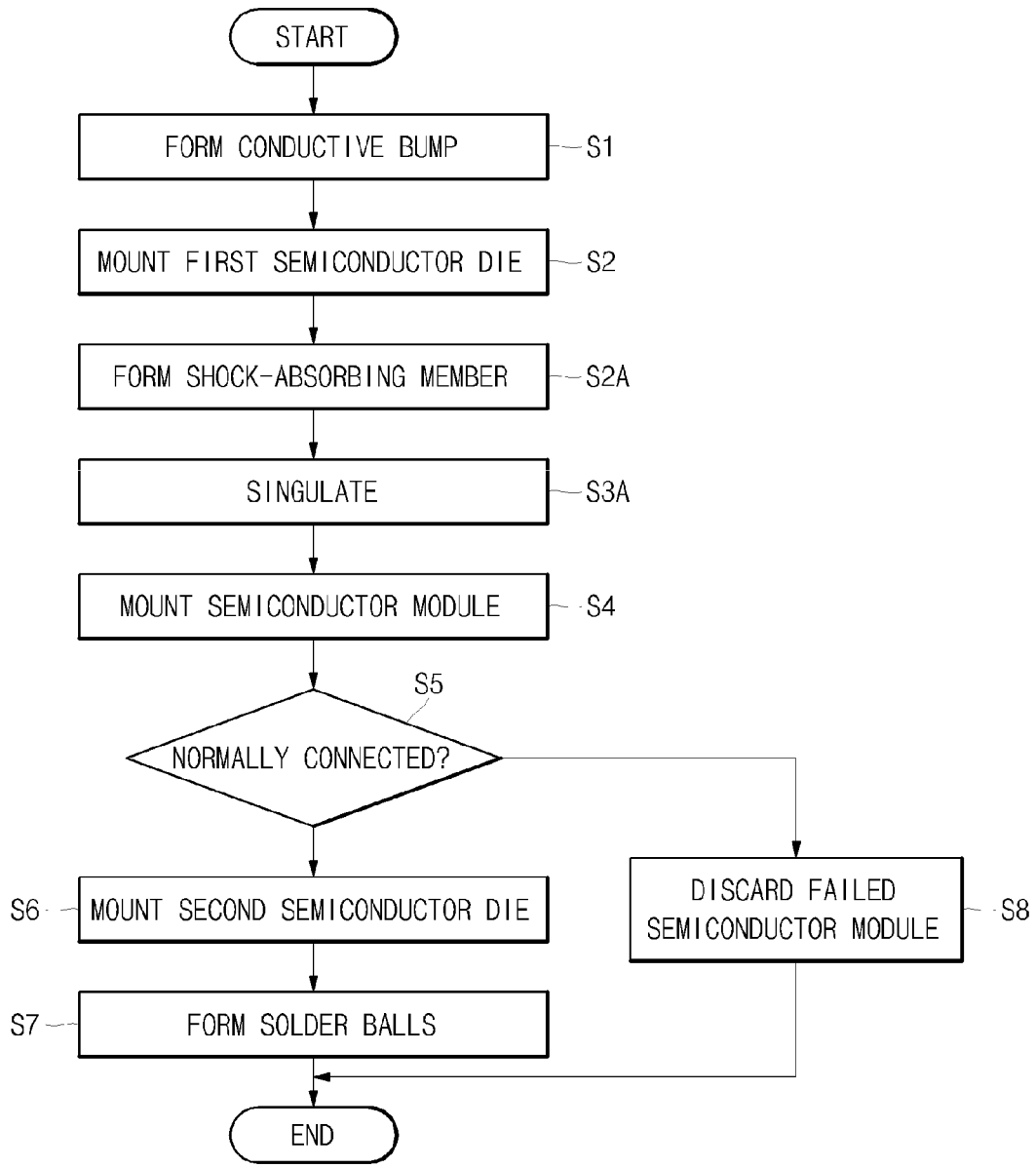
FIG. 3 is a flowchart of a manufacturing method of a semiconductor device according to various aspects of the disclosure.

Referring to FIG. 3, there is illustrated a flowchart of a manufacturing method of a semiconductor device according to various aspects of the present disclosure. As illustrated in FIG. 3, the manufacturing method of the semiconductor device according to another example embodiment of the present disclosure comprises forming conductive bumps (S1), mounting a first semiconductor die (S2), forming a shock-absorbing member (S2A), singulating (S3A), mounting a semiconductor module (S4), testing (S5), mounting a second semiconductor die (S6), forming solder balls (S7) and discarding a failed semiconductor module (S8). In the manufacturing method of the semiconductor device illustrated in FIG. 3, the forming of the conductive bumps (S1), the mounting of the first semiconductor die (S2), the mounting of the semiconductor module (S4), the testing (S5), the mounting of the second semiconductor die (S6), the forming of the solder balls (S7) and the discarding of the failed semiconductor module (S8) may, for example, share any or all characteristics with corresponding example processing of the example manufacturing method of the semiconductor device illustrated in FIGS. 1 and 2A to 2K. Therefore, the following description will be made with reference to FIGS. 4A to 4E with regard to the forming of the shock-absorbing member (S2A) and the singulating (S3A) in the manufacturing method of the semiconductor device illustrated in FIG. 3.

Figure 4A:
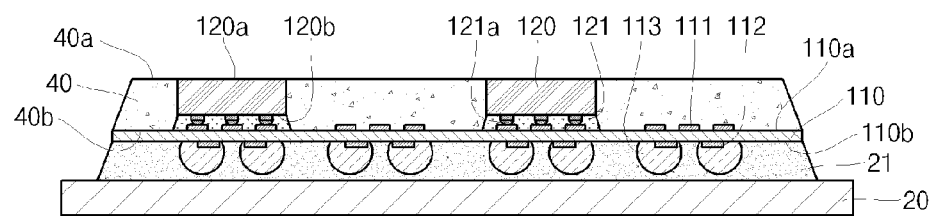
FIGS. 4A to 4E are cross-sectional views of a semiconductor device at various states of processing, in accordance with various aspects of the disclosure.

Referring to FIG. 4A, there is illustrated a cross-sectional view of an example of the forming of the shock-absorbing member (S2A) in the example manufacturing method of the semiconductor device. As illustrated in FIG. 4A, in the forming of the shock-absorbing member (S2A), a shock-absorbing member 40 may be formed to cover a first surface 110a of the interposer 110 having the first semiconductor die 120 formed thereon. The shock-absorbing member 40 may, for example, be formed by spin coating or vacuum printing, and may be cured by UV light or heat. The shock-absorbing member 40 may, for example, be formed to entirely cover the first surface 110a of the interposer 110 having the first semiconductor die 120 formed thereon. For example, the shock-absorbing member 40 may be formed to have a height corresponding to a height of the first semiconductor die 120. For example, the shock-absorbing member 40 may be configured such that its second surface 40b is in contact with the first surface 110a of the interposer 110, and a first surface 40a of the shock-absorbing member 40 may be coplanar with a first surface 120a of the first semiconductor die 120.

Referring to FIGS. 4B to 4E, there are illustrated cross-sectional views of an example of the singulating (S3A) in the manufacturing method of the semiconductor device. As illustrated in FIGS. 4B to 4E, in the singulating (S3A), the interposer 110 may be diced to be divided into discrete semiconductor modules 100x.

The singulating (S3A) may, for example, comprise attaching a first film 30A to cover the first surface 120a of the first semiconductor die 120 and a first surface 40a of the shock-absorbing member 40, attaching a second film 50 to a second surface 110b of the interposer 110, cleaning to remove the first film 30A and the shock-absorbing member 40, dicing the first surface 110a of the interposer 110 and expanding the second film 50 to increase a distance between discrete semiconductor modules 100x. Here, each of the semiconductor modules 100x may refer to an individual interposer 110 having one first semiconductor die 120 mounted thereon. For example, in the singulating (S3), the interposer 110 (e.g., an interposer wafer and/or panel comprising a plurality of separable interposer modules) having a plurality of first semiconductor die 120 mounted thereon may be divided into the plurality of semiconductor modules 100x as individual interposers 110 each comprising one first semiconductor die 120.

Figure 4B:
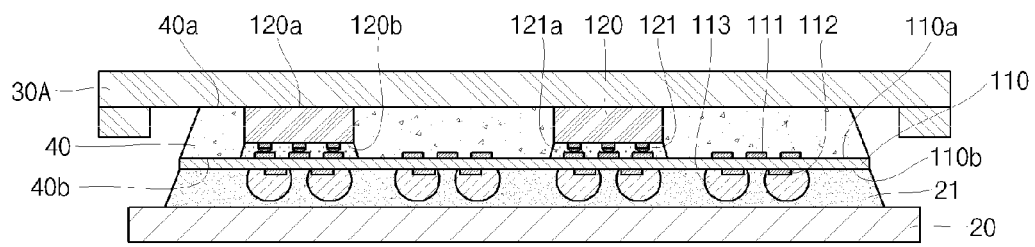

In the attaching of the first film 30A illustrated by example in FIG. 4B, the first film 30A may be attached to cover both of the first surface 40a of the shock-absorbing member 40 and the first surface 120a of the first semiconductor die 120. The first film 30A may be adhered to the first surface 40a of the shock-absorbing member 40 and the first surface 120a of the first semiconductor die 120, which may be substantially planar (and/or co-planar), thereby for example facilitating adhesion and preventing chucking from occurring due to a film adhesion failure caused by a step difference between the first semiconductor die 120 and the interposer 110. The first film 30A may comprise an adhesive layer cured by UV light or heat.

Figure 4C:
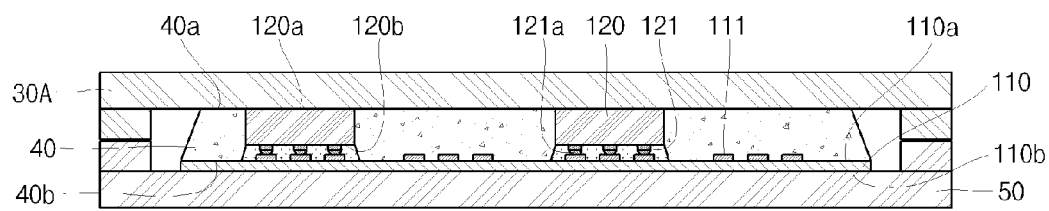

Thereafter, in the attaching of the second film 50, as illustrated by example in FIG. 4C, the second carrier 20 adhered to the second surface 110b of the interposer 110 may be separated from the second surface 110b of the interposer 110 and the second film 50 may be attached to the second surface 110b of the interposer 110. The second carrier 20 may be first separated from the second surface 110b of the interposer 110, and an adhesive 21 provided for adhesion between the second carrier 20 and the second surface 110b of the interposer 110 may be removed. Thereafter, the second film 50 is attached to cover both of the second surface 110b of the interposer 110 from which the second carrier 20 may be removed and conductive bumps 113 (shown covered in FIG. 4C).

Figure 4D:
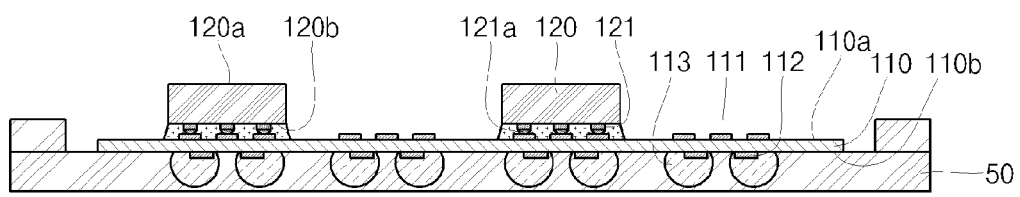

Thereafter, in the cleaning, as illustrated by example in FIG. 4D, the shock-absorbing member 40 formed on the first surface 110a of the interposer 110 and the first film 30A may be removed, thereby exposing the first surface 110a of the interposer 110 to the outside. UV light or heat may, for example, be applied to the shock-absorbing member 40 and the first film 30A to remove adhesion, and the shock-absorbing member 40 and the first film 30A may be removed by a cleaning process.

Figure 4E:
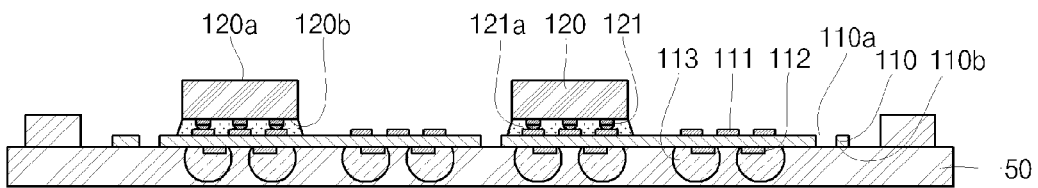

Thereafter, as illustrated by example in FIG. 4E, in the expanding, the shock-absorbing member 40 and the first film 30A may be removed from the first surface 110a of the interposer 110 and the interposer 110 may be diced into the respective semiconductor modules 100x from the first surface 110a of the interposer 110 exposed to the outside. The dicing may, for example, comprise blade dicing, laser dicing, and so on, but aspects of the present disclosure are not limited thereto. In addition, in the expanding, the second film 50 may be expanded to increase the distance between each of the diced semiconductor modules 100x, thereby providing additional separation between the modules and providing for convenient module handling (e.g., by automated pick-and-place equipment). Since the second film 50 may be expanded in a state in which it is attached to the second surface 110b of the interposer 110, the expanding may be more easily performed than the expanding in a state in which only a portion of the second film 50 is connected to the semiconductor modules 100x. In addition, adhesion may be removed by applying UV light or heat to the second film 50, and the respective semiconductor modules 100x may be separated through the picking-up operation.

The semiconductor device manufactured according to the illustrated embodiment may, for example, be the same as the semiconductor device manufactured by the manufacturing method illustrated in FIG. 2, for example sharing any or all characteristics.

Figure 5:
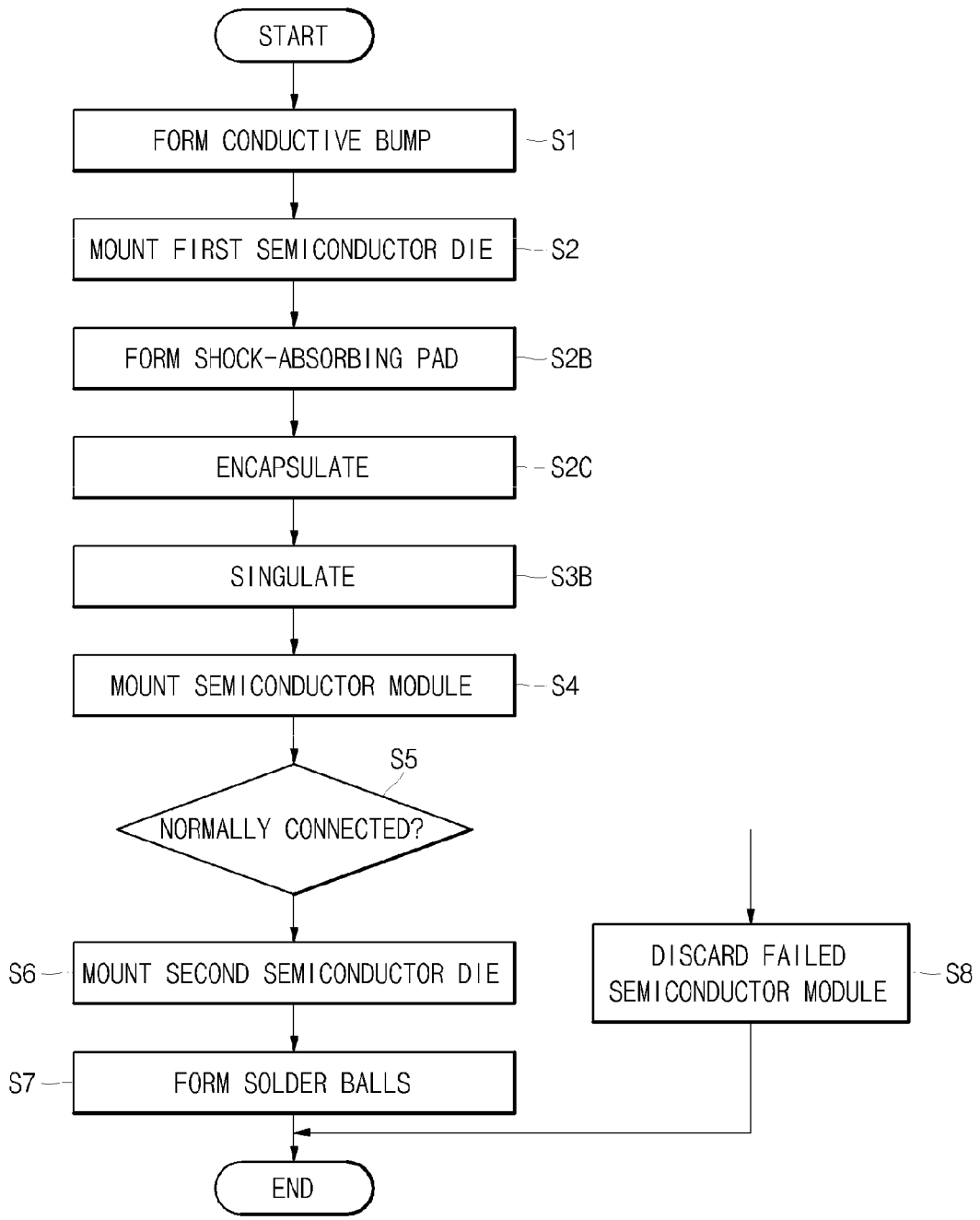
FIG. 5 is a flowchart of a manufacturing method of a semiconductor device according to various aspects of the disclosure.

Referring to FIG. 5, there is illustrated a flowchart of a manufacturing method of a semiconductor device according to various aspects of the present disclosure. As illustrated in FIG. 5, the manufacturing method of the semiconductor device according to another example embodiment of the present disclosure comprises forming conductive bumps (S1), mounting a first semiconductor die (S2), forming a shock-absorbing member (S2B), encapsulating (S2C), singulating (S3B), mounting a semiconductor module (S4), testing (S5), mounting a second semiconductor die (S6), forming solder balls (S7) and discarding a failed semiconductor module (S8). In the manufacturing method of the semiconductor device illustrated in FIG. 5, the forming of the conductive bumps (S1), the mounting of the first semiconductor die (S2), the mounting of the semiconductor module (S4), the testing (S5), the mounting of the second semiconductor die (S6), the forming of the solder balls (S7) and the discarding of the failed semiconductor module (S8) may, for example, share any or all characteristics with corresponding processing of the manufacturing method of the semiconductor device illustrated in FIGS. 1 and 2A to 2K and/or the manufacturing method of the semiconductor device illustrated in FIGS. 3 and 4A to 4E. Therefore, the following description will be made with reference to FIGS. 6A to 6F with regard to the forming of the shock-absorbing member (S2B), the encapsulating (S2C) and the singulating (S3B) in the example manufacturing method of the semiconductor device illustrated in FIG. 5.

Figure 6A:
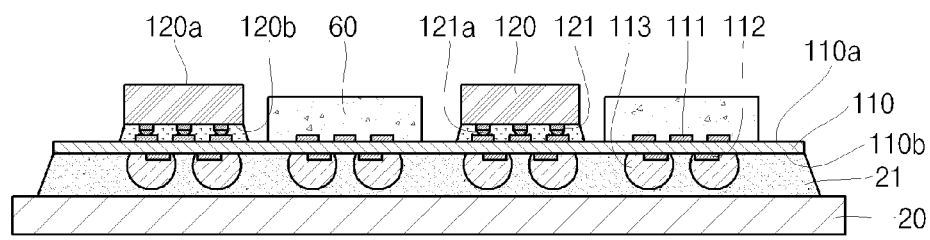
FIGS. 6A to 6G are cross-sectional views of a semiconductor device at various stages of processing, in accordance with various aspects of the disclosure.

Referring to FIG. 6A, there is illustrated a cross-sectional view of an example of the forming of the shock-absorbing member (S2B) in the example manufacturing method of the semiconductor device. As illustrated in FIG. 6A, in the forming of the shock-absorbing member (S2B), a shock-absorbing pad 60 may be formed to cover a first surface 110a of an interposer 110 having a first semiconductor die 120 formed thereon. The shock-absorbing pad 60 may, for example, be formed by printing. The shock-absorbing pad 60 may, for example, be formed at an area where a second semiconductor die 140 is to be formed in a subsequent process. The shock-absorbing pad 60 may, for example, be spaced apart from a side portion of the first semiconductor die 120 adjacent thereto and may be formed to cover first wiring patterns 111 of the interposer 110 exposed to the outside. For example, the shock-absorbing pad 60 may be formed to have a height corresponding to (or the same as) a height of the first semiconductor die 120 or may, for example, be shorter.

Figure 6B:
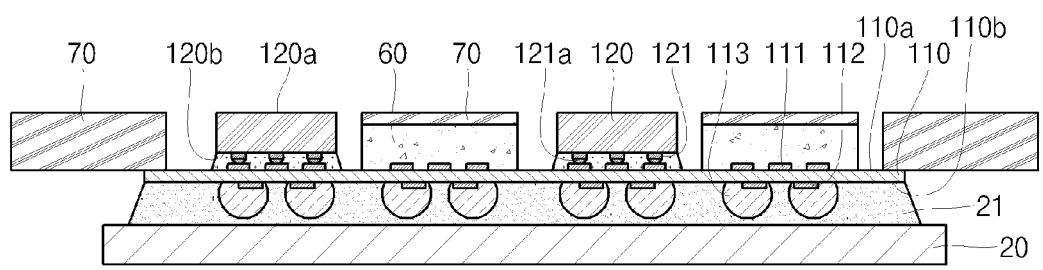
Figure 6C:
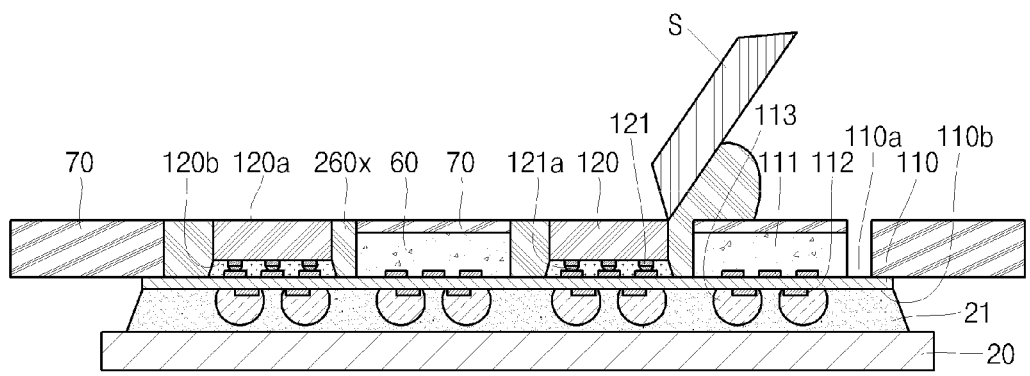
Figure 6D:
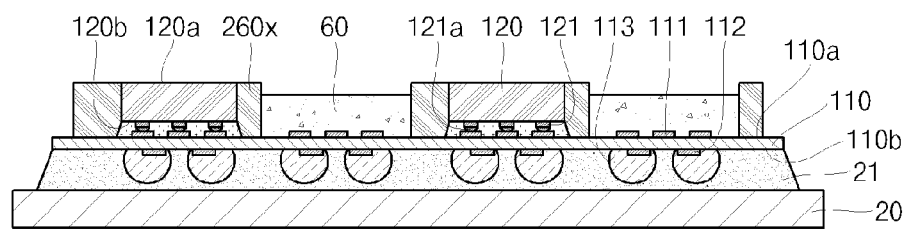

Referring to FIGS. 6B to 6D, there are illustrated cross-sectional views of an example of the encapsulating (S2C) in the manufacturing method of the semiconductor device. As illustrated in FIGS. 6B to 6D, in the encapsulating (S2C), an encapsulant 260x may be formed to cover a first semiconductor die 120.

First, in the encapsulating (S2C), a stencil 70 may be formed on an outer peripheral edge of a first surface 110a of the interposer 110. If a height of the shock-absorbing pad 60 is smaller than a height of the first semiconductor die 120, the stencil 70 may further be formed on a first surface 60a of the shock-absorbing pad 60, thereby making the first semiconductor die 120 and the shock-absorbing pad 60 have the same height. The stencil 70 may, for example, be formed by printing.

Thereafter, in the encapsulating (S2C), the encapsulant 260x in a liquid phase may be formed in a space between the first semiconductor die 120 and a shock-absorbing pad 60. Here, the encapsulant 260x may be inserted into the space between the first semiconductor die 120 and a shock-absorbing pad 60 through a squeegee S to be coplanar with the first surface 120a of the first semiconductor die 120. The thus formed liquid-phase encapsulant 260x may be cured and the stencil 70 removed, thereby forming the encapsulant 260x. Here, the first surface 120a of the first semiconductor die 120 and the first surface 60a of the shock-absorbing pad 60 may be exposed to the outside, and the encapsulant 260x may be interposed between the first semiconductor die 120 and the shock-absorbing pad 60.

Figure 6E:
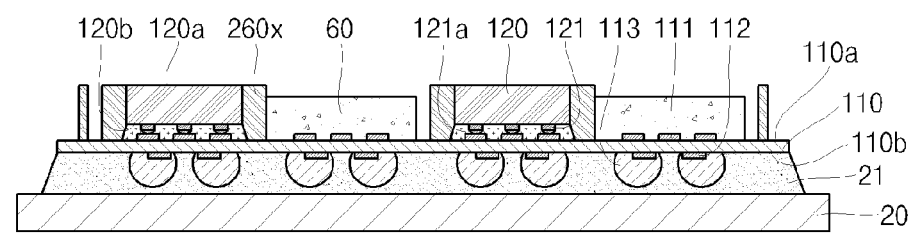
Figure 6F:
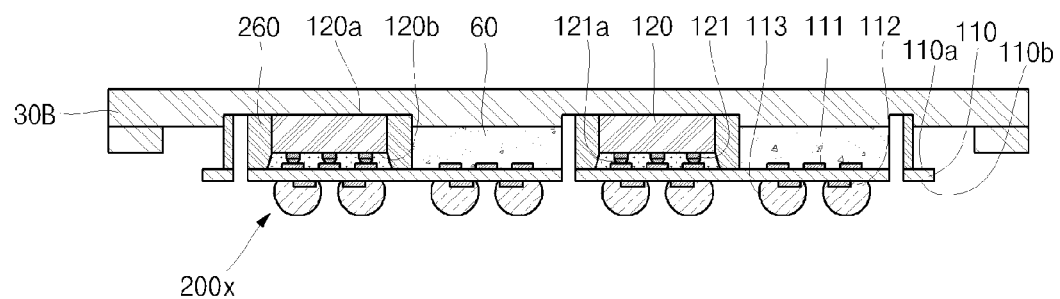

Referring to FIGS. 6E and 6F, there are illustrated cross-sectional views of an example of the singulating (S3B) in the manufacturing method of the semiconductor device. As illustrated in FIGS. 6E and 6F, in the singulating (S3B), an interposer 110 may be diced to divide the same into discrete semiconductor modules 200x.

The singulating (S3B) may, for example, comprise dicing the encapsulant 260x formed on the first surface 110a of the interposer 110 and the interposer 110 into discrete semiconductor modules 200x, attaching a first film 30B to the first semiconductor die 120, the shock-absorbing pad 60 and the encapsulant 260x, and expanding the first film 30B to increase a distance between each of the discrete semiconductor modules 200x.

First, in the dicing, as illustrated by example in FIG. 6E, the encapsulant 260x and the interposer 110 may be diced from the first surface 110a of the interposer 110 to divide the same into discrete semiconductor modules 200x. The dicing may comprise blade dicing, and so on, but aspects of the present disclosure are not limited thereto. Here, each of the semiconductor modules 200x may refer to an individual interposer 110 having one first semiconductor die 120 mounted thereon. For example, in the dicing, the interposer 110 (e.g., a wafer or panel comprising a plurality of separable interpose modules) having a plurality of first semiconductor die 120 mounted thereon may be divided into a plurality of semiconductor modules 100x as individual interposers 110 each comprising one of the first semiconductor die 120. Here, side portions of the first semiconductor die 120 may be covered by the encapsulant 260x.

Thereafter, as illustrated in FIG. 6F, in the attaching of the first film 30B, the first film 30B may be attached to cover the first surface 120a of the first semiconductor die 120 and the first surface 60a of the shock-absorbing pad 60. Here, the first film 30B may be adhered to the first surface 120a of the first semiconductor die 120 and the first surface 60a of the shock-absorbing pad 60, which may be substantially planar (and/or co-planar), thereby for example facilitating adhesion. In addition, expanding may be more easily performed than the expanding in a state in which only a portion of the first film 30B is connected to the semiconductor modules 200x. Thereafter, the manufacturing method of the semiconductor device may further comprise expanding the first film 30B to increase the distance between each of the discrete semiconductor modules 200x. In addition, in the expanding, the first film 30B may be expanded to increase the distance between each of the diced semiconductor modules 200x, thereby providing additional separation between the modules and providing for convenient module handling (e.g. by automated pick-and-place equipment). In addition, adhesion may be removed by applying UV light or heat to the first film 30B, and the respective semiconductor modules 200x may be separated through the picking-up operation.

Figure 6G:
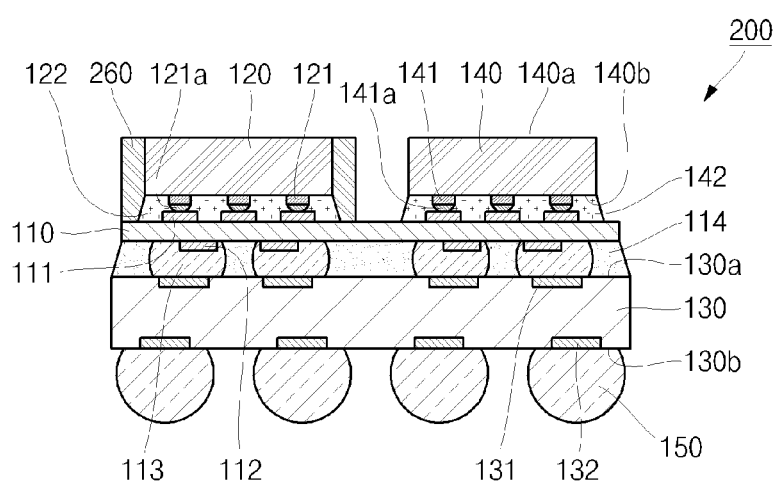

As illustrated in FIG. 6G, the completed semiconductor device 200 may, for example, be configured such that at least side portions of the first semiconductor die 120 are covered by an encapsulant 260. First conductive pillars 121 of the first semiconductor die 120 and second conductive pillars 141 of the second semiconductor die 140 may be connected to first wiring patterns 111 formed on the first surface 110a of the interposer 110. Here, the first semiconductor die 120 and the second semiconductor die 140 may be spaced apart from each other, and the side portions of the first semiconductor die 120 may be covered by the encapsulant 260.

In addition, conductive bumps 113 may be formed on the second wiring patterns 112 formed on the second surface 110b of the interposer 110, and the interposer 110 may be connected to a first conductive pattern 131 of a printed circuit board 130 through the conductive bumps 113. Further, solder balls 150 may be formed on a second conductive pattern 132 of the printed circuit board 130.

In summary, various aspects of the present disclosure provide a semiconductor device and a manufacturing method thereof. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A method of manufacturing a semiconductor device, the method comprising:
   mounting a first semiconductor die on a first surface of an interposer of a plurality of mechanically coupled interposers to electrically connect the first semiconductor die to the interposer;
   after the mounting of the first semiconductor die, forming a shock-absorbing member that covers at least all of side surfaces of the first semiconductor die and covers at least a portion of the first surface of the interposer;
   forming a semiconductor module comprising the interposer and the first semiconductor die by, at least in part, singulating the interposer from the plurality of mechanically coupled interposers;
   mounting the semiconductor module on a first surface of a printed circuit board to connect conductive structures on a second surface of the interposer to a first conductive pattern on the first surface of the printed circuit board;
   testing through at least a second conductive pattern on a second surface of the printed circuit board; and
   if the testing is passed, then mounting a second semiconductor die to the first surface of the interposer to electrically connect the second semiconductor die to the interposer;
   removing at least a portion of the shock-absorbing member prior to said mounting the second semiconductor die; and
   forming an underfill, different from the shock-absorbing member, between the first semiconductor die and the interposer.

2. The manufacturing method of claim 1, wherein the singulating the interposer comprises:
   attaching a film to cover at least the first surface of the interposer and the first semiconductor die; and
   after said attaching, cutting at the second surface of the interposer to form break lines that segment the interposer into semiconductor modules; and
   after said attaching and said cutting, expanding the film to increase a distance between the semiconductor modules.

3. The manufacturing method of claim 1, comprising, after all electronic component mounting to the interposer and to the printed circuit board is completed, forming conductive balls on the second conductive pattern on the second surface of the printed circuit board.

4. The manufacturing method of claim 1, wherein the interposer is not a printed circuit board.

5. The manufacturing method of claim 1, comprising, before the mounting of the first semiconductor die, forming the conductive structures on a second conductive pattern on the second surface of the interposer, the conductive structures comprising conductive bumps.

6. The manufacturing method of claim 1, wherein said forming the shock-absorbing member comprises forming the shock-absorbing member spaced laterally apart from the first semiconductor die.

7. The manufacturing method of claim 1, comprising, after the forming of the shock-absorbing member, encapsulating to cover at least side portions of the first semiconductor die and the first surface of the interposer by, at least in part, forming an encapsulant in a space between the first semiconductor die and the shock-absorbing member.

8. The manufacturing method of claim 1, wherein said mounting the first semiconductor die on the first surface of the interposer comprises coupling conductive pillars between the first semiconductor die and the first surface of the interposer, wherein the conductive pillars are a different type of conductive structure than the conductive structures on the second surface of the interposer.

9. A method of manufacturing a semiconductor device, the method comprising:
   mounting a first semiconductor die on a first surface of an interposer of a plurality of mechanically coupled interposers to electrically connect the first semiconductor die to the interposer;
   after the mounting of the first semiconductor die, forming a shock-absorbing member that covers at least all of side surfaces of the first semiconductor die and covers at least a portion of the first surface of the interposer;
   forming a semiconductor module comprising the interposer and the first semiconductor die by, at least in part, singulating the interposer from the plurality of mechanically coupled interposers;
   mounting the semiconductor module on a first surface of a printed circuit board to connect conductive structures on a second surface of the interposer to a first conductive pattern on the first surface of the printed circuit board;
   testing through at least a second conductive pattern on a second surface of the printed circuit board;
   if the testing is passed, then mounting a second semiconductor die to the first surface of the interposer to electrically connect the second semiconductor die to the interposer; and
   removing at least a portion of the shock-absorbing member prior to said mounting the second semiconductor die,
   wherein the singulating the interposer comprises:
     attaching a first film to cover the shock-absorbing member and a first surface of the first semiconductor die;
     attaching a second film to cover the second surface of the interposer;
     removing the first film and at least a portion of the shock-absorbing member; and
     cutting at the first surface of the interposer to segment the interposer into a plurality of semiconductor modules, comprising the semiconductor module, and expanding the second film to increase a distance between the semiconductor modules.

10. A method of manufacturing a semiconductor device, the method comprising:
    mounting a first semiconductor die on a first surface of an interposer of a plurality of mechanically coupled interposers to electrically connect the first semiconductor die to the interposer;
    after the mounting of the first semiconductor die, forming a shock-absorbing pad that covers a portion of the first conductive pattern of the interposer that is not connected to the first semiconductor die;
    forming a semiconductor module comprising the interposer and the first semiconductor die by, at least in part, singulating the interposer from the plurality of mechanically coupled interposers;
    mounting the semiconductor module on a first surface of a printed circuit board to connect conductive structures on a second surface of the interposer to a first conductive pattern on the first surface of the printed circuit board;
    testing through at least a second conductive pattern on a second surface of the printed circuit board;

if the testing is passed, then mounting a second semiconductor die to the first surface of the interposer to electrically connect the second semiconductor die to the interposer; and removing at least a portion of the shock-absorbing pad prior to said mounting the second semiconductor die.

11. The manufacturing method of claim 10, comprising, after the forming of the shock-absorbing pad, encapsulating to cover at least side portions of the first semiconductor die and the first surface of the interposer by, at least in part, forming an encapsulant in a space between the first semiconductor die and the shock-absorbing pad.

12. The manufacturing method of claim 11, wherein the singulating the interposer comprises:

cutting the encapsulant covering the first surface of the interposer to segment the encapsulant into semiconductor modules;

attaching a film to cover the encapsulant and the shock-absorbing pad; and expanding the film to increase the distance between the semiconductor modules.

13. A method of manufacturing a semiconductor device, the method comprising:

mounting a first semiconductor die on a first surface of an interposer of a plurality of mechanically coupled interposers to electrically connect the first semiconductor die to the interposer;

after the mounting of the first semiconductor die, forming a shock-absorbing member that covers at least all of side surfaces of the first semiconductor die and covers at least a portion of the first surface of the interposer;

forming a semiconductor module comprising the interposer and the first semiconductor die by, at least in part, singulating the interposer from the plurality of mechanically coupled interposers;

mounting the semiconductor module on a first surface of a printed circuit board to connect conductive structures on a second surface of the interposer to a first conductive pattern on the first surface of the printed circuit board;

testing through at least a second conductive pattern on a second surface of the printed circuit board;

if the testing is passed, then mounting a second semiconductor die to the first surface of the interposer to electrically connect the second semiconductor die to the interposer; and removing at least a portion of the shock-absorbing member prior to said mounting the second semiconductor die, wherein a first surface of the first semiconductor die facing away from the interposer is exposed from the shock-absorbing member.

14. A method of manufacturing a semiconductor device, the method comprising:

mounting a first semiconductor die on a first surface of an interposer of a plurality of mechanically coupled interposers;

forming a shock-absorbing pad that covers a portion of a first conductive pattern of the interposer that is not covered by the first semiconductor die; and forming a semiconductor module comprising the interposer and the first semiconductor die by, at least in part, singulating the interposer from the plurality of mechanically coupled interposers;

mounting the semiconductor module on a first surface of a substrate to connect conductive structures on a second surface of the interposer to a first conductive pattern on the first surface of the substrate;

testing through at least the substrate;

if the testing is passed, then mounting a second semiconductor die on the first surface of the interposer; and prior to said mounting the second semiconductor die, removing at least a portion of the shock-absorbing pad.

15. The manufacturing method of claim 14, wherein the singulating the interposer comprises:

attaching a film to cover at least the first surface of the interposer and the first semiconductor die; and after said attaching, cutting at the second surface of the interposer to form break lines that segment the interposer into semiconductor modules; and after said attaching and said cutting expanding the film to increase a distance between the semiconductor modules.

16. The manufacturing method of claim 14, wherein said forming the shock-absorbing pad comprises printing the shock-absorbing pad.

17. The manufacturing method of claim 14, wherein said forming the shock-absorbing pad comprises forming the shock-absorbing pad spaced laterally apart from the first semiconductor die.

18. The manufacturing method of claim 14, comprising, after the forming of the shock-absorbing pad, forming an encapsulant in a space between the first semiconductor die and the shock-absorbing pad, wherein the encapsulant covers at least all of side surfaces of the first semiconductor die and covers at least a portion of the first surface of the interposer.

19. A method of manufacturing a semiconductor device, the method comprising:

mounting a first semiconductor die on a first surface of an interposer of a plurality of mechanically coupled interposers;

forming a shock-absorbing member of a single material that covers at least a portion of side surfaces of the first semiconductor die and covers at least a portion of the first surface of the interposer;

forming a semiconductor module comprising the interposer and the first semiconductor die by, at least in part, singulating the interposer from the plurality of mechanically coupled interposers;

mounting the semiconductor module on a first surface of a substrate;

testing through a conductive pattern of the substrate;

if the testing is passed, then mounting a second semiconductor die on to the first surface of the interposer; and prior to said mounting the second semiconductor die, removing at least a portion of the shock-absorbing member.

20. The method of claim 19, wherein singulating the interposer comprises:

attaching a first film to cover the shock-absorbing member and a first surface of the first semiconductor die;

attaching a second film to cover a second surface of the interposer;

removing the first film and the shock-absorbing member; and cutting at the first surface of the interposer to segment the interposer into a plurality of semiconductor modules, comprising the semiconductor module, and expanding the second film to increase a distance between the semiconductor modules.

* * * * *